(12) United States Patent
Roy et al.

(10) Patent No.: US 10,164,681 B2
(45) Date of Patent: Dec. 25, 2018

(54) ISOLATING NOISE SOURCES AND COUPLING FIELDS IN RF CHIPS

(71) Applicant: SKYWORKS SOLUTIONS, INC., Woburn, MA (US)

(72) Inventors: Ambarish Roy, Waltham, MA (US); Nuttapong Srirattana, Billerica, MA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/613,629

(22) Filed: Jun. 5, 2017

(65) Prior Publication Data

US 2017/0353211 A1 Dec. 7, 2017

Related U.S. Application Data

(60) Provisional application No. 62/411,862, filed on Oct. 24, 2016, provisional application No. 62/345,998, filed on Jun. 6, 2016.

(51) Int. Cl.
*H01L 23/552* (2006.01)
*H04B 1/525* (2015.01)
(Continued)

(52) U.S. Cl.
CPC ............ *H04B 1/525* (2013.01); *G06F 1/182* (2013.01); *H01L 23/5225* (2013.01); *H01L 23/5385* (2013.01); *H01L 23/552* (2013.01); *H01L 23/66* (2013.01); *H01L 24/16* (2013.01); *H01L 24/48* (2013.01); *H01L 2223/6611* (2013.01); *H01L 2223/6655* (2013.01); *H01L 2223/6677* (2013.01); *H01L 2224/04042* (2013.01); *H01L 2224/05554* (2013.01); *H01L 2224/16227* (2013.01); *H01L 2224/48227* (2013.01); *H01L 2924/19105* (2013.01)

(58) Field of Classification Search
CPC ..... H04B 1/525; H01L 23/5225; H01L 24/48; H01L 23/5385; H01L 23/66; H01L 23/552; H01L 2924/19105; H01L 2224/16227; H01L 2224/04042; H01L 2223/6677; H01L 2223/6655; H03F 3/195; G06F 1/182
See application file for complete search history.

(56) References Cited

U.S. PATENT DOCUMENTS

| 3,611,199 A | 10/1971 | Safran |
| 3,868,594 A | 2/1975 | Cornwell et al. |

(Continued)

FOREIGN PATENT DOCUMENTS

| EP | 2503701 A2 | 9/2012 |
| JP | S62-159502 A | 7/1987 |

(Continued)

*Primary Examiner* — Kyoung Lee
(74) *Attorney, Agent, or Firm* — Lando & Anastasi, LLP

(57) ABSTRACT

A semiconductor die comprises a first active device, at least one of a second active device and a passive component, and electromagnetic shielding configured to at least partially electromagnetically isolate the first active device from the at least one of the second active device and the passive component. The electromagnetic shielding includes one of a grounded metal layer and via stack, and a grounded metal layer disposed one of above and below the first active device.

20 Claims, 18 Drawing Sheets

(51) Int. Cl.
*G06F 1/18* (2006.01)
*H01L 23/538* (2006.01)
*H01L 23/66* (2006.01)
*H01L 23/522* (2006.01)
*H01L 23/00* (2006.01)

(56) References Cited

U.S. PATENT DOCUMENTS

| | | |
|---|---|---|
| 4,460,875 A | 7/1984 | Harman |
| 4,677,399 A | 6/1987 | Le Dain et al. |
| 4,764,740 A | 8/1988 | Meyer |
| 5,038,112 A | 8/1991 | O'Neill |
| 5,222,246 A | 6/1993 | Wolkstein |
| 5,276,411 A | 1/1994 | Woodin, Jr. et al. |
| 5,363,071 A | 11/1994 | Schwent et al. |
| 5,487,184 A | 1/1996 | Nagode |
| 5,625,328 A | 4/1997 | Coleman, Jr. |
| 5,745,016 A | 4/1998 | Salminen |
| 5,767,753 A | 6/1998 | Ruelke |
| 5,903,820 A | 5/1999 | Hagstrom |
| 6,020,795 A | 2/2000 | Kim |
| 6,078,299 A | 6/2000 | Scharfe, Jr. |
| 6,108,527 A | 8/2000 | Urban et al. |
| 6,329,880 B2 | 12/2001 | Akiya |
| 6,496,708 B1 | 12/2002 | Chan et al. |
| 6,559,740 B1 | 5/2003 | Schulz et al. |
| 6,771,141 B2 | 8/2004 | Iida et al. |
| 6,803,818 B2 | 10/2004 | van Amerom |
| 6,972,640 B2 | 12/2005 | Nagamori et al. |
| 7,042,309 B2 | 5/2006 | Podell |
| 7,224,244 B2 | 5/2007 | Drapac et al. |
| 7,230,316 B2 | 6/2007 | Yamazaki et al. |
| 7,236,069 B2 | 6/2007 | Puoskari |
| 7,305,223 B2 | 12/2007 | Liu et al. |
| 7,319,370 B2 | 1/2008 | Napijalo |
| 7,336,142 B2 | 2/2008 | Vogel |
| 7,493,093 B2 | 2/2009 | Boerman et al. |
| 7,538,635 B2 | 5/2009 | Fukuda et al. |
| 7,546,089 B2 | 6/2009 | Bellantoni |
| 7,966,140 B1 | 6/2011 | Gholson, III et al. |
| 7,973,358 B2 | 7/2011 | Hanke et al. |
| 8,115,234 B2 | 2/2012 | Nakajima et al. |
| 8,175,554 B2 | 5/2012 | Camuffo et al. |
| 8,248,302 B2 | 8/2012 | Tsai et al. |
| 8,289,102 B2 | 10/2012 | Yamamoto et al. |
| 8,315,576 B2 | 11/2012 | Jones |
| 8,334,580 B2 * | 12/2012 | Sakurai ............... H01L 23/66 257/508 |
| 8,417,196 B2 | 4/2013 | Kitching et al. |
| 8,526,890 B1 | 9/2013 | Chien et al. |
| 8,606,198 B1 | 12/2013 | Wright |
| 8,633,761 B2 | 1/2014 | Lee |
| 8,761,026 B1 | 6/2014 | Berry et al. |
| 8,810,331 B2 | 8/2014 | Gu et al. |
| 9,014,647 B2 | 4/2015 | Kitching et al. |
| 9,214,967 B2 | 12/2015 | Reisner et al. |
| 9,356,330 B1 | 5/2016 | Donoghue et al. |
| 9,425,835 B2 | 8/2016 | Seckin et al. |
| 9,496,902 B2 | 11/2016 | Srirattana et al. |
| 9,553,617 B2 | 1/2017 | Srirattana et al. |
| 9,634,371 B2 | 4/2017 | Swarup et al. |
| 9,647,314 B1 | 5/2017 | Nguyen et al. |
| 9,748,627 B2 | 8/2017 | Sun et al. |
| 9,755,670 B2 | 9/2017 | Chen et al. |
| 2002/0097100 A1 | 7/2002 | Woods et al. |
| 2002/0113601 A1 | 8/2002 | Swank |
| 2002/0113666 A1 | 8/2002 | Yamazaki et al. |
| 2002/0139975 A1 | 10/2002 | Lewis et al. |
| 2003/0214365 A1 | 11/2003 | Adar et al. |
| 2004/0127178 A1 | 7/2004 | Kuffner |
| 2004/0201526 A1 | 10/2004 | Knowles et al. |
| 2005/0017821 A1 | 1/2005 | Sawicki |
| 2005/0040912 A1 | 2/2005 | Pelz |
| 2005/0146394 A1 | 7/2005 | Podell |
| 2005/0170794 A1 | 8/2005 | Koukkari et al. |
| 2005/0239421 A1 | 10/2005 | Kim et al. |
| 2006/0232359 A1 | 10/2006 | Fukuda et al. |
| 2007/0082642 A1 | 4/2007 | Hattori |
| 2007/0159268 A1 | 7/2007 | Podell |
| 2008/0036554 A1 | 2/2008 | Krausse et al. |
| 2008/0055187 A1 | 3/2008 | Tamura et al. |
| 2008/0056638 A1 | 3/2008 | Glebov et al. |
| 2008/0070519 A1 | 3/2008 | Okabe |
| 2008/0112466 A1 | 5/2008 | Sasaki |
| 2009/0134953 A1 | 5/2009 | Hunt et al. |
| 2009/0195335 A1 | 8/2009 | Wahl et al. |
| 2009/0278624 A1 | 11/2009 | Tsai et al. |
| 2009/0280755 A1 | 11/2009 | Camuffo et al. |
| 2009/0322313 A1 | 12/2009 | Zhang et al. |
| 2011/0057746 A1 | 3/2011 | Yamamoto et al. |
| 2011/0063044 A1 | 3/2011 | Jones |
| 2011/0148548 A1 | 6/2011 | Uhm et al. |
| 2011/0199166 A1 | 8/2011 | Carrillo-Ramirez |
| 2011/0254637 A1 | 10/2011 | Manssen et al. |
| 2011/0279192 A1 | 11/2011 | Nash et al. |
| 2011/0298559 A1 | 12/2011 | Kitching et al. |
| 2012/0019332 A1 | 1/2012 | Hino et al. |
| 2012/0019335 A1 | 1/2012 | Hoang et al. |
| 2012/0062333 A1 | 3/2012 | Ezzeddine et al. |
| 2012/0071123 A1 | 3/2012 | Jones et al. |
| 2012/0195351 A1 | 8/2012 | Banwell et al. |
| 2012/0243579 A1 | 9/2012 | Premakanthan et al. |
| 2013/0005284 A1 | 1/2013 | Dalipi |
| 2013/0113575 A1 | 5/2013 | Easter |
| 2013/0194054 A1 | 8/2013 | Presti |
| 2013/0207741 A1 | 8/2013 | Presti |
| 2013/0241668 A1 | 9/2013 | Tokuda et al. |
| 2013/0293316 A1 | 11/2013 | Kitching et al. |
| 2013/0307635 A1 | 11/2013 | Kase et al. |
| 2014/0152253 A1 | 6/2014 | Ozaki et al. |
| 2014/0266499 A1 | 9/2014 | Noe |
| 2014/0368293 A1 | 12/2014 | Mukaiyama |
| 2015/0002239 A1 | 1/2015 | Tanaka |
| 2015/0042412 A1 | 2/2015 | Imbornone et al. |
| 2015/0043669 A1 | 2/2015 | Ella et al. |
| 2015/0048910 A1 | 2/2015 | LaFountain et al. |
| 2015/0072632 A1 | 3/2015 | Pourkhaatoun et al. |
| 2015/0091668 A1 | 4/2015 | Solomko et al. |
| 2015/0200437 A1 | 7/2015 | Solomko et al. |
| 2015/0249485 A1 | 9/2015 | Ouyang et al. |
| 2015/0270821 A1 | 9/2015 | Natarajan et al. |
| 2015/0326202 A1 | 11/2015 | Nicholls et al. |
| 2015/0349742 A1 | 12/2015 | Chen et al. |
| 2015/0372366 A1 | 12/2015 | Frye |
| 2016/0025928 A1 | 1/2016 | Onawa |
| 2016/0028147 A1 | 1/2016 | Srirattana et al. |
| 2016/0028420 A1 | 1/2016 | Srirattana et al. |
| 2016/0043458 A1 | 2/2016 | Sun et al. |
| 2016/0065167 A1 | 3/2016 | Granger-Jones et al. |
| 2016/0079649 A1 | 3/2016 | Ilkov et al. |
| 2016/0079650 A1 | 3/2016 | Solomko et al. |
| 2016/0172737 A1 | 6/2016 | Srirattana et al. |
| 2016/0172738 A1 | 6/2016 | Srirattana et al. |
| 2016/0172739 A1 | 6/2016 | Srirattana et al. |
| 2016/0172740 A1 | 6/2016 | Srirattana et al. |
| 2016/0268994 A1 | 9/2016 | Granger-Jones et al. |
| 2016/0344430 A1 | 11/2016 | Srirattana et al. |
| 2016/0344431 A1 | 11/2016 | Srirattana et al. |
| 2016/0373146 A1 | 12/2016 | Manssen et al. |
| 2017/0026020 A1 | 1/2017 | Solomko et al. |
| 2017/0033428 A1 | 2/2017 | Ootsuka et al. |
| 2017/0063425 A1 | 3/2017 | Khlat et al. |
| 2017/0085245 A1 | 3/2017 | Srirattana et al. |
| 2017/0141802 A1 | 5/2017 | Solomko et al. |

FOREIGN PATENT DOCUMENTS

| | | |
|---|---|---|
| JP | 2000-077915 A | 3/2000 |
| JP | 2001127664 A | 5/2001 |
| JP | 2013126067 A | 6/2013 |
| KR | 20040037465 A | 5/2004 |
| KR | 20110118289 A | 10/2011 |
| KR | 20120007790 A | 1/2012 |

(56) References Cited

FOREIGN PATENT DOCUMENTS

| WO | 2005018451 A1 | 3/2005 |
| WO | 2015020927 A2 | 2/2015 |
| WO | 2015134979 A1 | 9/2015 |

* cited by examiner

US 10,164,681 B2

ISOLATING NOISE SOURCES AND COUPLING FIELDS IN RF CHIPS

CROSS-REFERENCE TO RELATED APPLCIATIONS

This application claims priority under 35 U.S.C. § 119(e) to U.S. Provisional Patent Application Ser. No. 62/411,862 titled "ISOLATING NOISE SOURCES AND COUPLING FIELDS IN RF CHIPS," filed Oct. 24, 2016 and to U.S. Provisional Patent Application Ser. No. 62/345,998 titled "ISOLATING NOISE SOURCES AND COUPLING FIELDS IN RF CHIPS," filed Jun. 6, 2016. Each of these applications is incorporated herein in its entirety for all purposes.

BACKGROUND

As integrated circuits continue to shrink in size, the individual devices and circuitry in the integrated circuits are being placed closer and closer together. The physical proximity of devices and circuitry within modern integrated circuits may facilitate electromagnetic crosstalk between adjacent components. Electromagnetic crosstalk between components or devices on an integrated circuit may induce noise in signals being carried or processed by the circuitry and devices of the integrated circuit, reducing the performance of the integrated circuit. This problem may be especially troublesome in radio frequency (RF) integrated circuits were high frequency signals in some devices or conductors on the integrated circuit may induce electromagnetic fields which cause noise and interference in other devices or conductors on the integrated circuit. For example, as illustrated in FIG. 1, adjacent conductors 10 and 15 on a semiconductor substrate 20 may exhibit capacitive coupling, inductive coupling, or both, either through the substrate 20 or through the space between the conductors 10, 15. Changing current flow, for example, an RF signal, through one of the conductors, for example, conductor 10 may create a changing magnetic field that induces noise in conductor 15 in the form of voltage or current variations. These voltage or current variations may reduce a signal to noise ratio of a signal carried on conductor 15, reducing the performance of the circuit.

SUMMARY

Aspects and embodiments relate to electronic systems and, in particular, to structures and methods for electromagnetically isolating devices of an integrated circuit, for example, a radio frequency integrated circuit from one another.

In accordance with an aspect, there is provided a semiconductor die. The semiconductor die comprises a first active device, a second active device, and electromagnetic shielding configured to at least partially electromagnetically isolate the first active device from the second active device, the electromagnetic shielding including a grounded metal layer and via stack.

In some embodiments, the electromagnetic shielding further comprises a grounded through-wafer via. The grounded through-wafer via may be in electrical communication with the grounded metal layer and via stack. The grounded metal layer and via stack may be electrically coupled to ground through the through-wafer via.

In some embodiments, the electromagnetic shielding further comprises an area of active semiconductor. The area of active semiconductor may be an area of N-type semiconductor and application of a negative bias to the area of active semiconductor may improve a degree of electromagnetic isolation between the first active device and the second active device. The area of active semiconductor may be an area of P-type semiconductor and application of a positive bias to the area of active semiconductor may improve a degree of electromagnetic isolation between the first active device and the second active device.

In some embodiments, the electromagnetic shielding comprises a continuous wall disposed between the first active device and the second active device. The continuous wall may be a linear wall. The continuous wall may be a meandering wall.

In some embodiments, the electromagnetic shielding circumscribes an area including the first active device.

In some embodiments, the electromagnetic shielding comprises a multi-layer wall disposed between the first active device and the second active device. At least one layer of the multi-layer wall may include multiple separate portions.

In accordance with another aspect, there is provided semiconductor die. The semiconductor die comprises a first active device, a second active device, and electromagnetic shielding configured to at least partially electromagnetically isolate the first active device from the second active device, the electromagnetic shielding including a grounded metal layer disposed one of above and below the first active device.

In some embodiments, the electromagnetic shielding further comprises a grounded through-wafer via. The grounded through-wafer via may be in electrical communication with the grounded metal layer. The grounded metal layer may be electrically coupled to ground through the through-wafer via.

In some embodiments, the electromagnetic shielding further comprises an area of active semiconductor. The area of active semiconductor may be an area of N-type semiconductor and application of a negative bias to the area of active semiconductor may improve a degree of electromagnetic isolation between the first active device and the second active device. The area of active semiconductor may be an area of P-type semiconductor and application of a positive bias to the area of active semiconductor may improve a degree of electromagnetic isolation between the first active device and the second active device.

In accordance with another aspect, there is provided a packaged module. The packaged module comprises a substrate configured to receive a plurality of components, at least one electrical contact disposed on the substrate, and a semiconductor die implemented in conjunction with the substrate and electrically connected to the at least one electrical contact, the semiconductor die including a first active device, a second active device, and electromagnetic shielding configured to at least partially electromagnetically isolate the first active device from the second active device, the electromagnetic shielding including a grounded metal layer and via stack formed in the semiconductor die and electrically coupled to the at least one electrical contact disposed on the substrate.

The packaged module may be included in an electronic device. The packaged module may be included in a wireless communications device.

In accordance with an aspect, there is provided a semiconductor die. The semiconductor die comprises an active device, a passive component, and electromagnetic shielding configured to at least partially electromagnetically isolate the active device from the passive component, the electromagnetic shielding including a grounded metal layer and via stack.

In some embodiments, the electromagnetic shielding further comprises a grounded through-wafer via. The grounded through-wafer via may be in electrical communication with the grounded metal layer and via stack. The grounded metal layer and via stack may be electrically coupled to ground through the through-wafer via.

In some embodiments, the electromagnetic shielding further comprises an area of active semiconductor. The area of active semiconductor may an area of N-type semiconductor and application of a negative bias to the area of active semiconductor may improve a degree of electromagnetic isolation between the active device and the passive component. The area of active semiconductor may be an area of P-type semiconductor and application of a positive bias to the area of active semiconductor may improve a degree of electromagnetic isolation between the active device and the passive component.

In some embodiments, the electromagnetic shielding comprises a continuous wall disposed between the active device and the passive component. The continuous wall may be a linear wall. The continuous wall may be a meandering wall.

In some embodiments, the electromagnetic shielding circumscribes an area including the active device.

In some embodiments, the electromagnetic shielding comprises a multi-layer wall disposed between the active device and the passive component. At least one layer of the multi-layer wall may include multiple separate portions.

In accordance with another aspect, there is provided a packaged module. The module comprises a substrate configured to receive a plurality of components, at least one electrical contact disposed on the substrate, and a semiconductor die implemented in conjunction with the substrate and electrically connected to at least one electrical contact, the semiconductor die including an active device, a passive component, and electromagnetic shielding configured to at least partially electromagnetically isolate the active device from the passive component, the electromagnetic shielding including a grounded metal layer and via stack.

The packaged module may be included in an electronic device. The packaged module may be included in a wireless communications device.

In accordance with an aspect, there is provided a semiconductor die. The semiconductor die comprises an active device, a passive component, and electromagnetic shielding configured to at least partially electromagnetically isolate the active device from the passive component, the electromagnetic shielding including a grounded metal layer disposed one of above and below the active device.

In some embodiments, the electromagnetic shielding further comprises a grounded through-wafer via. The grounded through-wafer via may be in electrical communication with the grounded metal layer. The grounded metal layer may be electrically coupled to ground through the through-wafer via.

In some embodiments, the electromagnetic shielding further comprises an area of active semiconductor. The area of active semiconductor may be an area of N-type semiconductor and application of a negative bias to the area of active semiconductor may improve a degree of electromagnetic isolation between the active device and the passive component. The area of active semiconductor may be an area of P-type semiconductor and application of a positive bias to the area of active semiconductor may improve a degree of electromagnetic isolation between the active device and the passive component.

In accordance with another aspect, there is provided a packaged module. The module comprises a substrate configured to receive a plurality of components, at least one electrical contact disposed on the substrate, and a semiconductor die implemented in conjunction with the substrate and electrically connected to at least one electrical contact, the semiconductor die including an active device, a passive component, and electromagnetic shielding configured to at least partially electromagnetically isolate the active device from the passive component, the electromagnetic shielding including a grounded metal layer disposed one of above and below the active device.

The packaged module may be included in an electronic device. The packaged module may be included in a wireless communications device.

In accordance with an aspect, there is provided a semiconductor die. The semiconductor die comprises a first active device, at least one of a second active device and a passive component, and electromagnetic shielding configured to at least partially electromagnetically isolate the first active device from the at least one of the second active device and the passive component, the electromagnetic shielding including one of a grounded metal layer and via stack, and a grounded metal layer disposed one of above and below the first active device.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments disclosed herein include systems and methods for reducing crosstalk and noise induced in components of an integrated circuit by other components of the integrated circuit.

Figure 1:
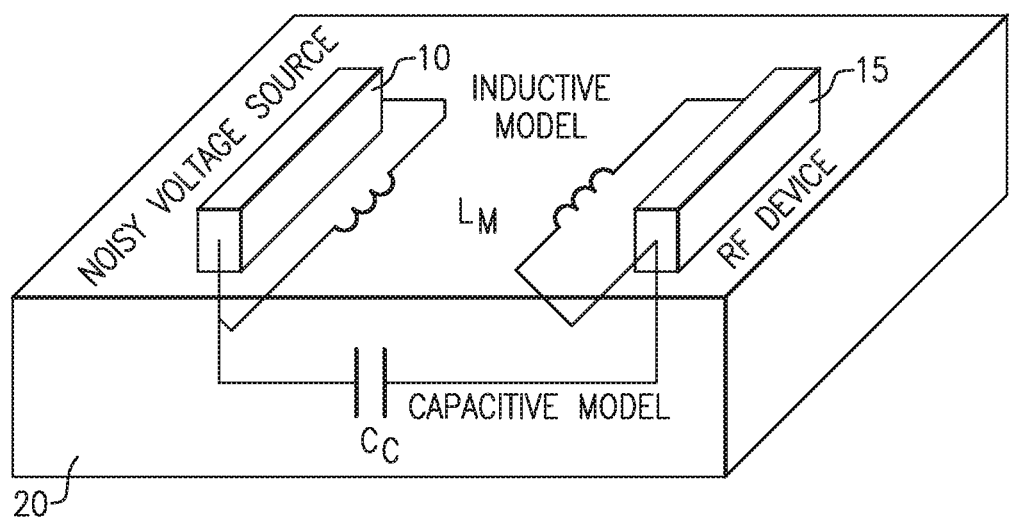
FIG. 1 illustrates electromagnetic crosstalk between two conductors on an integrated circuit.
Figure 2:
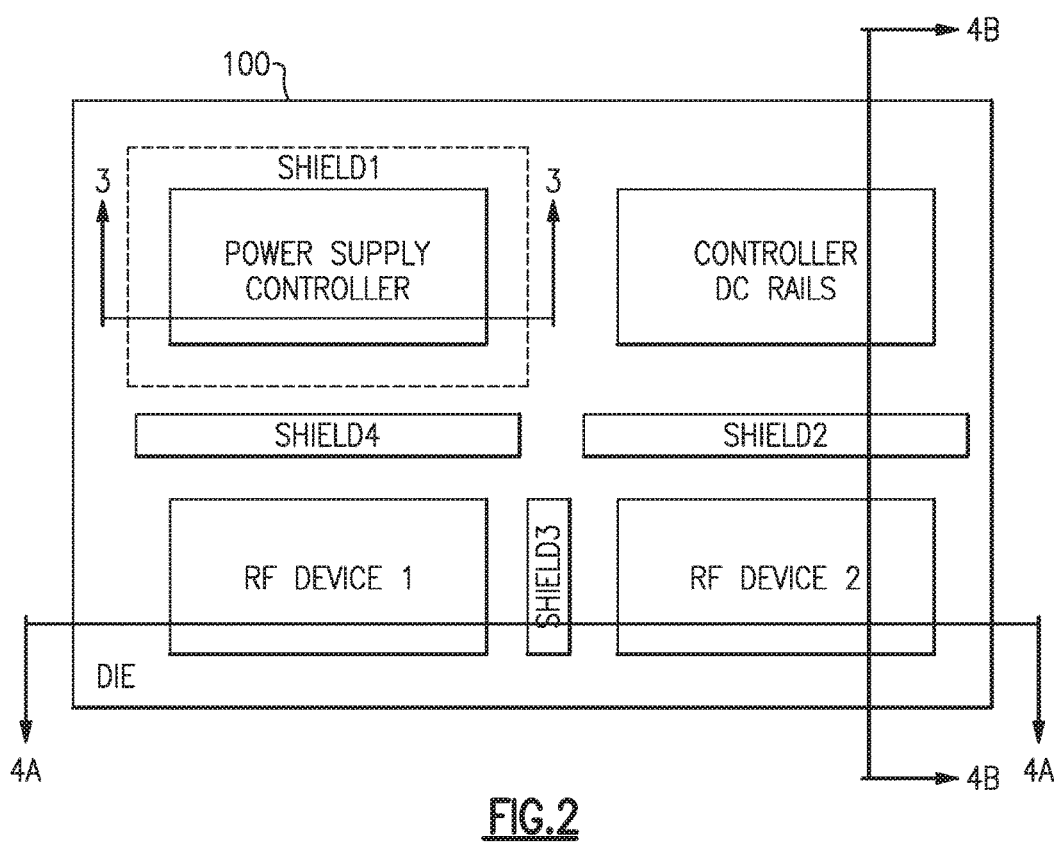
FIG. 2 illustrates a plan view of a portion of a semiconductor die.

A highly simplified diagram of various components that may be present in an integrated circuit, for example, an RF integrated circuit is illustrated in plan view in FIG. 2. As illustrated in FIG. 2 an embodiment of an RF integrated circuit includes at least a portion of a die 100 on which various components are disposed. The components may include a Power Supply Controller that provides power at a desired voltage, for example, one or more stable direct current (DC) voltages, to other devices on the die. The Power Supply Controller may include, for example, voltage regulators, charge pumps, power converters (e.g., buck, boost, or buck-boost converters), and/or other devices associated with power management. The Power Supply Controller is a source of electromagnetic noise that can interfere with the operation of other components or devices, and may be susceptible to noise from other devices on the die that could interfere with the stability of power provided by the Power Supply Controller.

The Controller DC Rails illustrated in FIG. 2 represent conductors associated with the Power Supply Controller that conduct power from the Power Supply Controller to other devices on the die. The die may also include one or more RF devices, represented by RF Device 1 and RF Device 2, which may be, for example, RF signal transmission or receiving circuits, amplifiers, filters, multiplexers, couplers, switches, or any other type of RF device.

Shielding may be provided on or in the die to reduce or eliminate the propagation of electromagnetic signals generated in one or more of the devices on the die to other devices on the die. The shielding electromagnetically isolates the various devices and components on the die from one another to reduce or eliminate interference or noise caused in one device or component from other devices or components.

Figure 3:
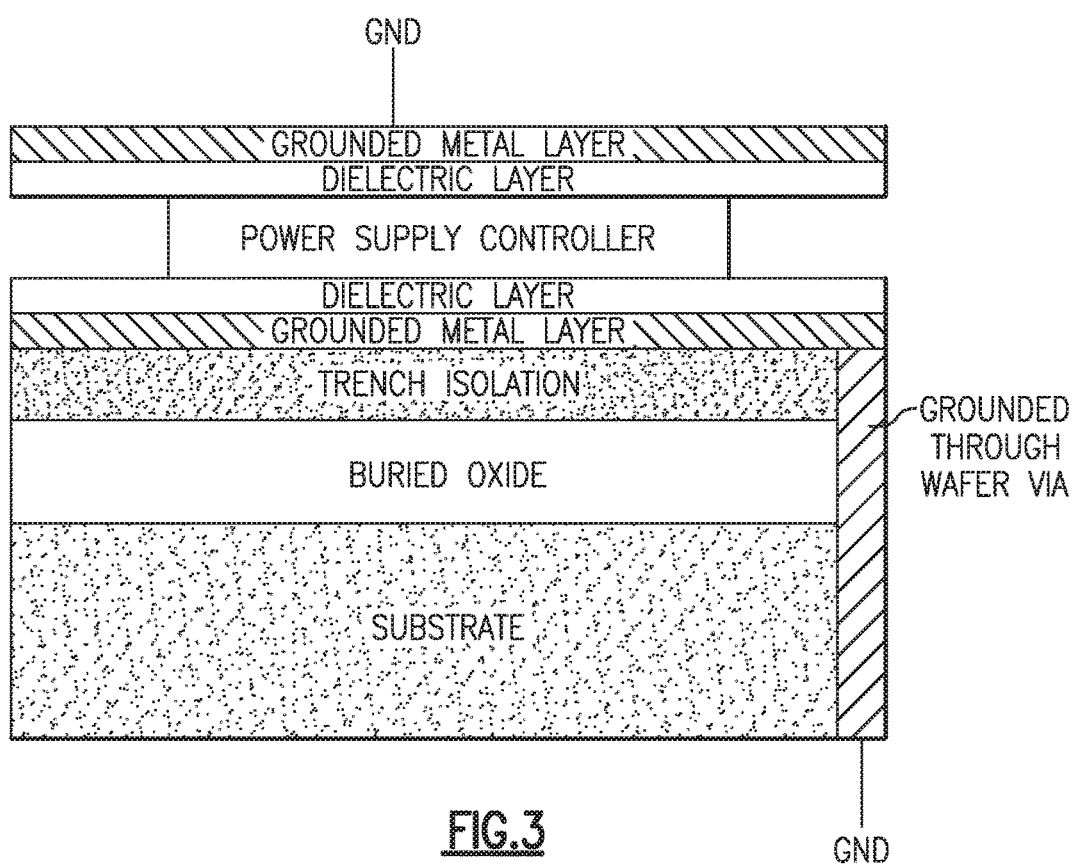
FIG. 3 is a cross sectional view of a portion of the semiconductor die of FIG. 2.

Shield 1 protects the other devices and components on the die from noise generated in the Power Supply Controller. Shield 1 is, in some embodiments, a conductor, for example, a metal layer, that is disposed above and/or below the circuitry of the Power Supply Controller and that is electrically coupled to ground. Electromagnetic noise generated in the Power Supply Controller is shunted by Shield 1 to ground rather than propagating to other devices or components on the die. FIG. 3 illustrates an embodiment of Shield 1. As illustrated, the circuitry comprising the Power Supply Controller is sandwiched between two grounded metal layers and separated from the grounded metal layers by dielectric layers. A metal layer below the Power Supply Controller on the substrate side of the Power Supply Controller may be coupled to ground by a grounded through-wafer via. A metal layer above the Power Supply Controller opposite the substrate side of the Power Supply Controller may be coupled to ground by a conductive trace and/or bond pad (not shown). In some embodiments, the metal layer above the Power Supply Controller or the metal layer below the Power Supply Controller may be omitted.

Shield 2 electromagnetically isolates the Controller DC Rails from electromagnetic interference or noise that might be generated by RF Device 2 and that might cause fluctuations in the power supplied by the Controller DC Rails. Shield 3 electromagnetically isolates RF Device 2 from electromagnetic interference or noise that might be generated by RF Device 1 and that might cause fluctuations in signals being processed by RF Device 2 and/or that might induce undesired voltages in the circuitry of RF Device 2 that might disrupt the operation of RF Device 2. Shield 3 also electromagnetically isolates RF Device 1 from RF Device 2. In some embodiments, for example, in the absence of Shield 3, electromagnetic noise from RF Device 1 can induce a voltage in the circuitry of RF Device 2 that may be higher than the breakdown voltage or a threshold voltage of a device, for example, a diode in RF Device 2 and could inadvertently turn RF Device 2 "ON" or "OFF." Absent Shield 3, RF Device 2 can have a similar effect on RF Device 1. Shield 4 electromagnetically isolates the Power Supply Controller from electromagnetic interference or noise that might be generated by RF Device 2 and that might cause fluctuations in the voltage supplied by the Power Supply Controller.

Figure 4A:
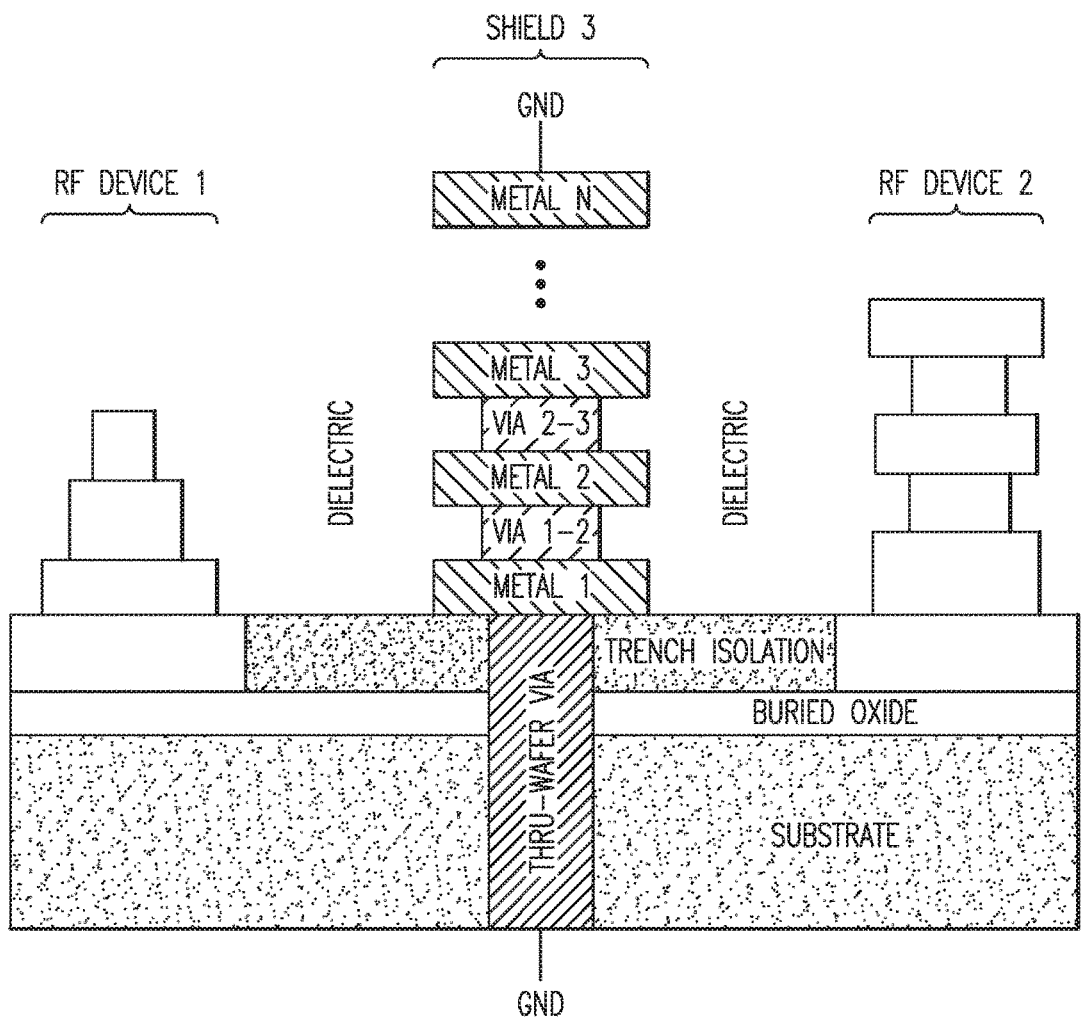
FIG. 4A is a cross sectional view of another portion of the semiconductor die of FIG. 2.
Figure 4B:
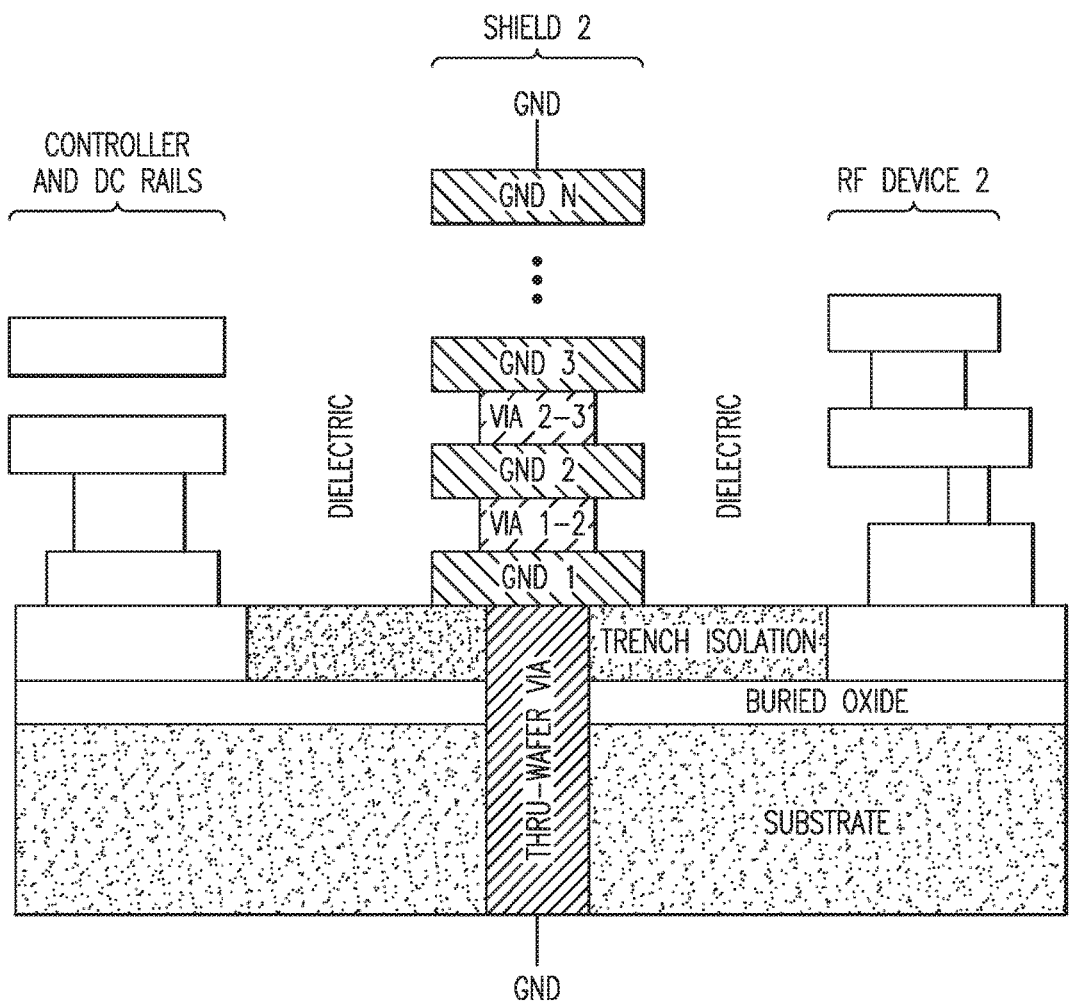
FIG. 4B is a cross sectional view of another portion of the semiconductor die of FIG. 2.

In one embodiment, one or more of Shield 2, Shield 3, or Shield 4 may be formed from portions of one or more layers of metal and vias and/or one or more through-wafer vias that are electrically coupled to ground. The portions of the layers of metal and vias may be electrically coupled to ground through the through-wafer via or through a separate ground line. This type of shield may target both inductive and capacitive coupling. FIG. 4A illustrates one embodiment of this type of shield (an embodiment of Shield 3) in cross section in a silicon-on-insulator (SOI) device and FIG. 4B illustrates another embodiment of this type of shield (an embodiment of Shield 2) in cross section in a silicon-on-insulator (SOI) device. Shield 4 may be constructed in a manner substantially similar to Shield 3, but may be positioned between the RF device 1 and a portion of Shield 1, for example, the grounded through wafer via and/or grounded metal layer(s) of Shield 1. It is to be appreciated that the die need not necessarily include the various layers illustrated in FIG. 4A or 4B, as one or more of the trench isolation layer, the buried oxide layer, or the substrate layer may be omitted. Further, the various types of shielding disclosed herein are not limited to SOI devices, as they may also be used with other types of substrates, for example, GaAs substrates.

Shown in FIG. 4A is a typical SOI device in which a through-wafer via electrically couples the lowest metal layer (Metal 1) to the back of the substrate to electromagnetically isolate a first RF device from a second RF device formed on a common SOI substrate. FIG. 4B illustrates a similarly constructed SOI device in accordance with aspects of the present disclosure in which portions of multiple metal layers are connected via a through-wafer via to a grounding layer, for example, a grounding layer or grounding line disposed on the back of the substrate to electromagnetically isolate an RF device from the controller DC rails formed on a common SOI substrate. The portions of the metal layers that are electrically connected to ground are portions of the metal layers that are not used to carry signals between devices of the die. The shielding structures illustrated in FIG. 4A and FIG. 4B may additionally be electrically coupled to ground through a separate ground line, indicated as the line "GND" coupled to the uppermost metal layer, indicated as "METAL N" in FIG. 4A and "GND N" in FIG. 4B.

In accordance with aspects of the present disclosure in the construction of Shield 1, Shield 2, Shield 3, and/or Shield 4 one or more, or all, metal layers below portions of metal layers needed for signal routing are grounded. Additionally or alternatively, portions of one or more, or all, metal layers that are not used for signal routing that are disposed above portions of metal layers that are used for signal routing are grounded.

Figure 5:
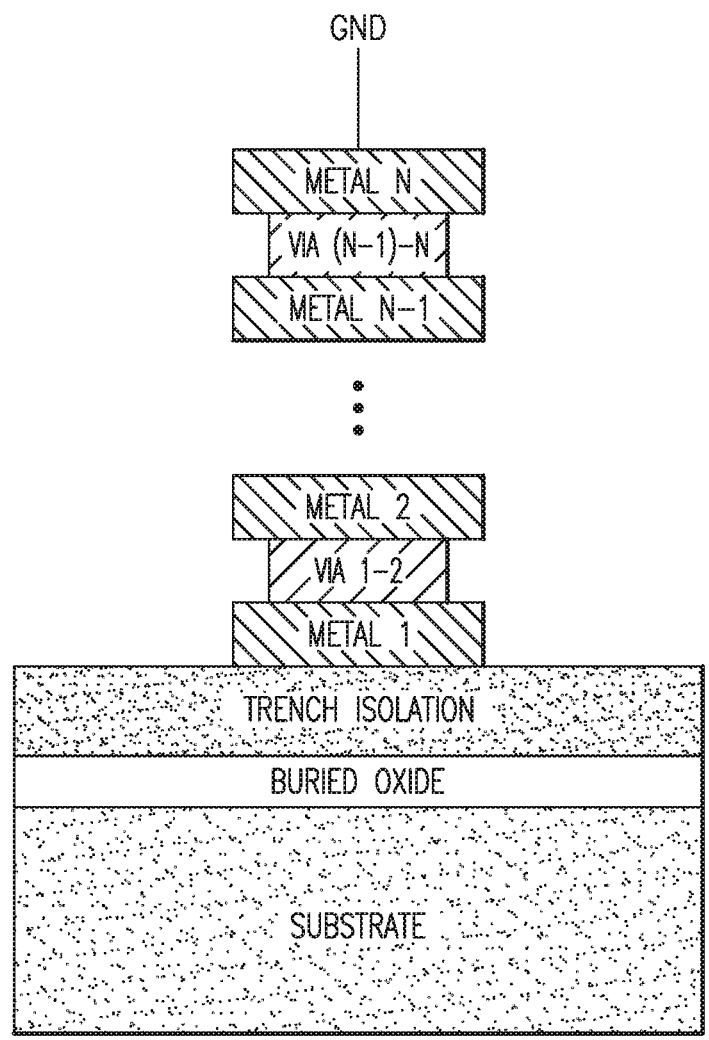
FIG. 5 is a cross sectional view of an embodiment of electromagnetic shielding for components of the portion of the semiconductor die of FIG. 2.

Another embodiment of an electromagnetic shield that may be utilized in accordance with aspects disclosed herein is illustrated in cross section in FIG. 5. In the electromagnetic shield of FIG. 5, the layers of metal in a metal stack on the surface of the die and associated vias are electrically coupled to ground through the top metal layer "METAL N." No through-wafer via is included in the shield of FIG. 5. The shield of FIG. 5 may be utilized between devices or components in areas of a die in which no through-wafer vias are present, for example, in a central portion of a die or a portion displaced from edge portions of the die where through-wafer vias may be present. In some embodiments, portions of lower metal layers, for example, portions of Metal 1 and/or Metal 2 disposed between portions of upper metal layers, for example, Metal N-1 and Metal N that are coupled to ground may be used to carry signals between devices of the die.

Figure 6:
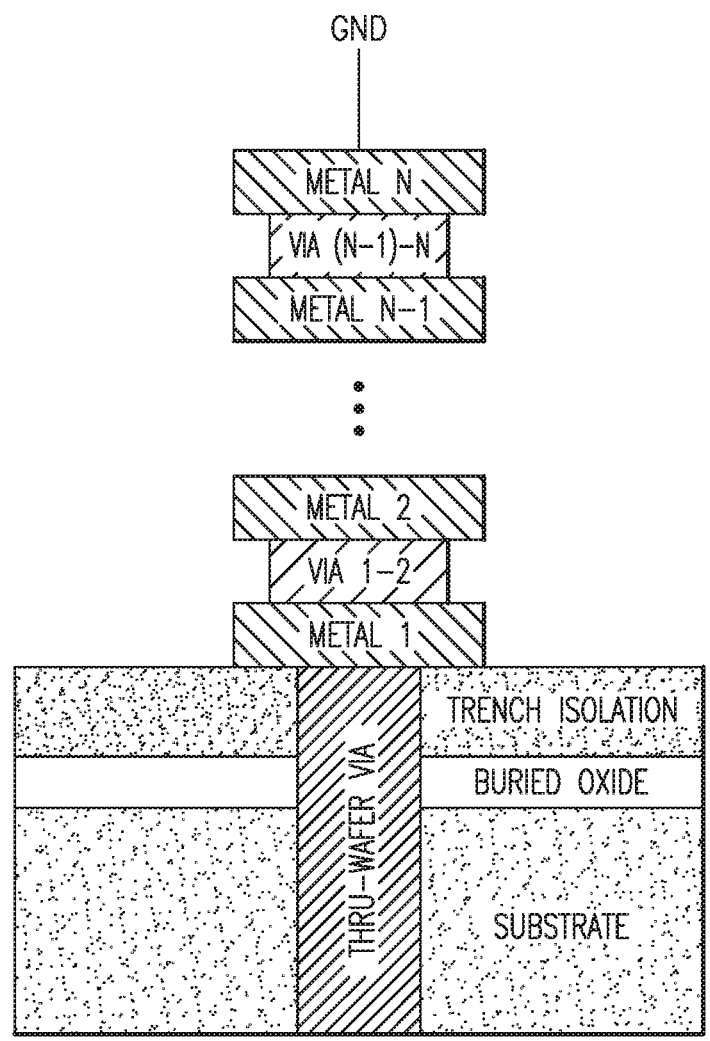
FIG. 6 is a cross sectional view of another embodiment of electromagnetic shielding for components of the portion of the semiconductor die of FIG. 2.

FIG. 6 is a cross sectional diagram of an electromagnetic shield similar to that illustrated in FIG. 4A and FIG. 4B. The shield of FIG. 6 includes portions of layers of metal in a metal/via stack on the surface of the die and an associated through-wafer via or vias electrically coupled to ground. As in the embodiment of FIG. 5, the top most metal layer "Metal N" is coupled to ground. Additionally, the lowermost metal layer "Metal 1" is electrically connected to a through-wafer via that continues all the way through to the opposite (back) side of the wafer. The through-wafer via is illustrated as centered beneath the metal layer and via stack, however, it should be appreciated that in other embodiments, the through-wafer via may be offset from the metal layer and via stack. The shield of FIG. 6 differs from that illustrated in FIG. 4A and FIG. 4B in that in the shield of FIG. 6, the electrical connection to ground is made through a separate ground line coupled to the top most metal layer, rather than directly to the through-wafer via. However, in some embodiments, the upper metal layers Metal N-1 and Metal N may be coupled to ground via the separate ground line and the lower metal layers Metal 1 and Metal 2 may be coupled to ground via the through-wafer via. In some embodiments a portion of a metal layer carrying signals between devices on the die may be disposed between and insulated from the grounded portions of the upper metal layers Metal N-1 and Metal N and the lower metal layers Metal 1 and Metal 2. Even in the absence of a ground line directly connected to the through-wafer via the through-wafer via may be coupled to ground through the metal and via stack and the ground line "GND" and may suppress or eliminate electromagnetic crosstalk between one device or component and another through the substrate. In alternate embodiments the through-wafer via may or may not be coupled to ground by a ground line directly connected to the through-wafer via.

Figure 7:
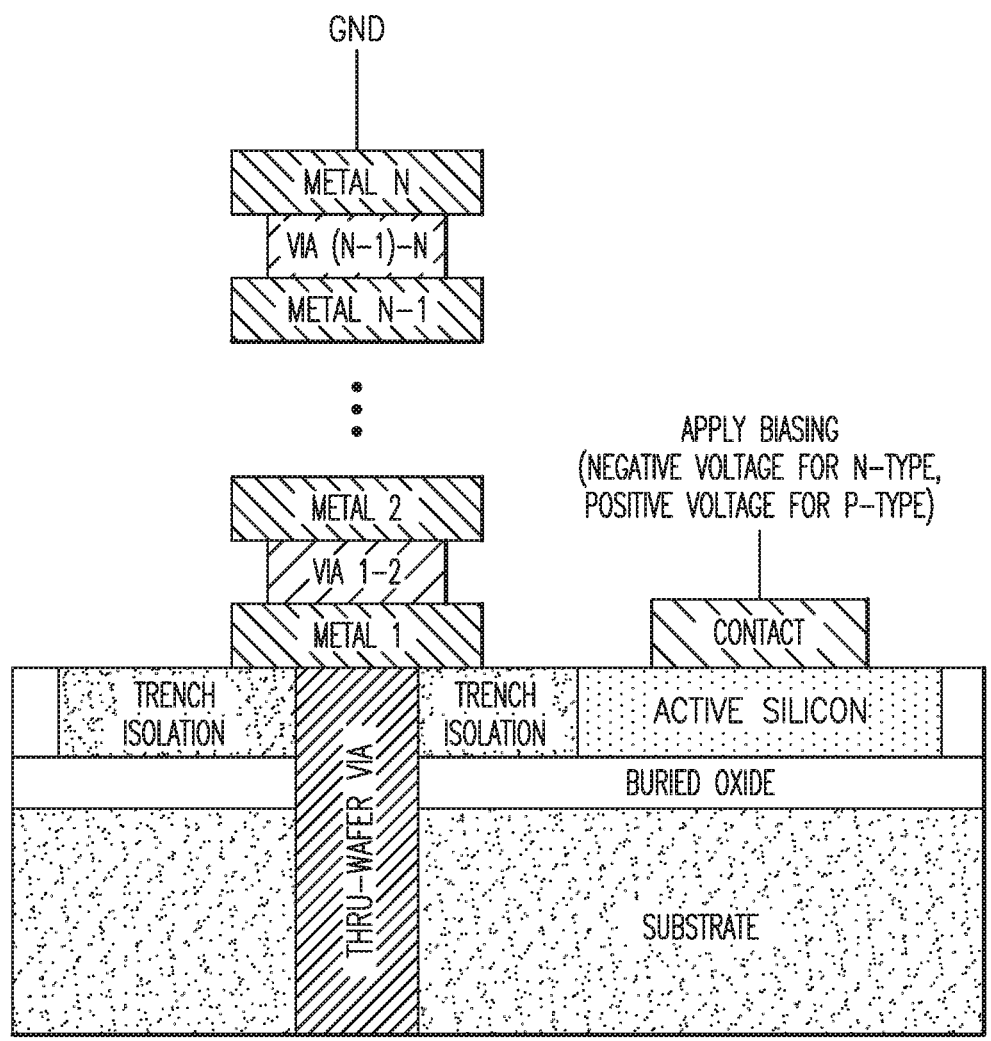
FIG. 7 is a cross sectional view of another embodiment of electromagnetic shielding for components of the portion of the semiconductor die of FIG. 2.

Another embodiment of an electromagnetic shield that may be utilized in accordance with aspects disclosed herein is illustrated in cross section in FIG. 7. In addition to the metal layers, vias, and through-wafer via of the shield of FIG. 6, the shield of FIG. 7 includes an area of active semiconductor, for example, silicon, and an electrical contact to the area of active semiconductor. There are no active devices in the illustrated area of active semiconductor. One or more active devices, for example, one or more transistors, a portion or a totality of a power controller and/or a portion or totality of an RF device are formed on or in an area of active semiconductor (not shown) that is laterally displaced from and insulated from the area of active semiconductor illustrated in FIG. 7. Biasing the area of active semiconductor (applying a negative voltage for N-type semiconductor, or a positive voltage for P-type semiconductor) creates a conductive layer in the illustrated layer of active semiconductor that behaves similar to a ground plane.

Figure 8:
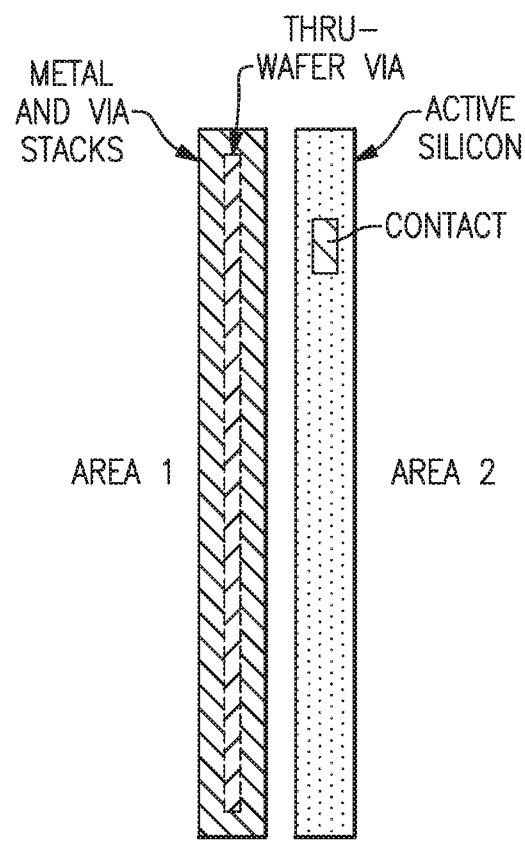
FIG. 8 is a plan view of an embodiment of electromagnetic shielding for components of the portion of the semiconductor die of FIG. 2.

Embodiments of the electromagnetic shielding may be provided in different patterns between devices, components, or areas on a die. As illustrated in FIG. 8, the electromagnetic shielding may be provided as a continuous wall between a first area (Area 1) including a first device or component and a second area (Area 2) including a second device or component that one desires to shield from the first device or component. The shielding illustrated in plan view in FIG. 8 is similar to the shielding illustrated in cross section in FIG. 7. The area of active semiconductor is illustrated as displaced from the metal and via stack and through-wafer via in FIGS. 7 and 8, however, it should be appreciated that in other embodiments, the area of active semiconductor may be partially or wholly disposed beneath the metal and via stack and may at least partially extend outside of an area defined beneath the metal and via stack.

Figure 9:
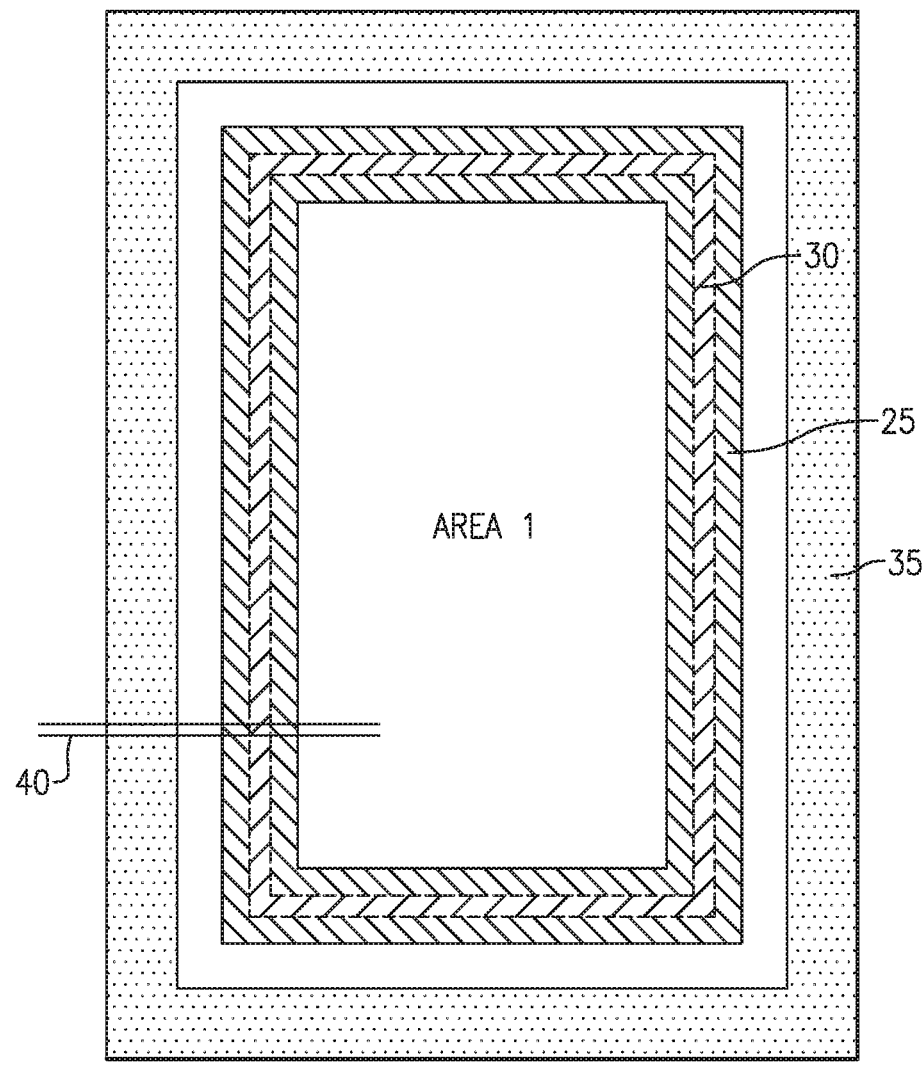
FIG. 9 is a plan view of another embodiment of electromagnetic shielding for components of the portion of the semiconductor die of FIG. 2.

In another embodiment, electromagnetic shielding may completely surround a first area (Area 1) including a first device or component. The electromagnetic shielding forms an island including Area 1 that is electromagnetically shielded from a second area (Area 2) including a second device or component that one desires to shield from the first device or component. As illustrated in FIG. 9, the electromagnetic shielding may include a metal layer and via stack component 25, a through-wafer via component 30, and an active semiconductor component 35. Each of components 25, 30, and 35 may completely circumscribe Area 1. Electrical conductors 40 used for routing between electrical components located in Areas 1 and 2 may be provided in a metal layer other than the metal layers used in the metal layer and via stack component 25. At least a portion of grounded shielding is disposed beneath the electrical conductors 40 to reduce or eliminate noise on conductors 40 from entering or exiting Area 1. The active semiconductor component 35 is illustrated as displaced from the metal layer and via stack component 25 and through-wafer via component 30, however, it should be appreciated that in other embodiments, the active semiconductor component 35 may be partially or wholly disposed beneath the metal layer and via stack component 25 and may at least partially extend outside of an area defined beneath the metal layer and via stack component 25. The electrical contact to the active semiconductor component 35 is not shown in FIG. 9 for ease of illustration.

Figure 10:
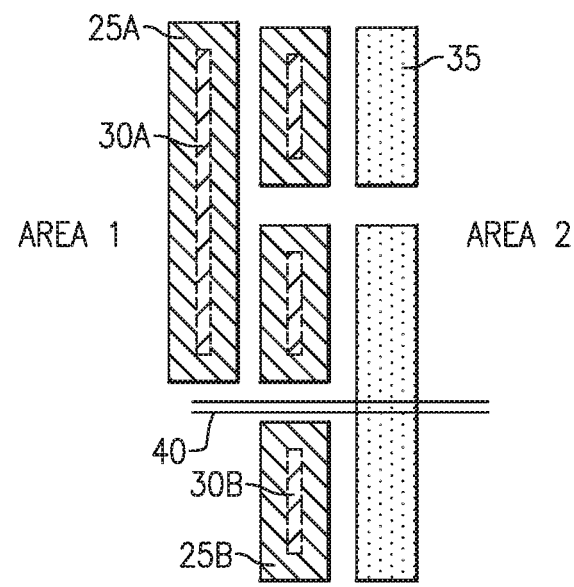
FIG. 10 is a plan view of another embodiment of electromagnetic shielding for components of the portion of the semiconductor die of FIG. 2.

The electromagnetic shielding may be provided in multiple sections and/or with multi-layer walls. As illustrated in FIG. 10, the electromagnetic shielding may be a wall having a first layer with first a metal layer and via stack component 25A and a through-wafer via component 30A, a second layer with a second metal layer and via stack component 25B and a through-wafer via component 30B broken into multiple portions, and a third layer of an active semiconductor component 35 which may be broken into multiple portions. The second layer of the metal layer and via stack component 25B and through-wafer via component 30B may be broken to allow for passage of electrical conductors 40 from Area 1 to Area 2. The electrical conductors 40 are formed on a metal layer in one or both of the metal layer and via stack components 25A, 25B or a metal layer other than a metal layer in one or both of the metal layer and via stack components 25A, 25B. At least a portion of grounded shielding is disposed beneath the electrical conductors 40 to reduce or eliminate noise on conductors 40 from entering or exiting Area 1. The active semiconductor component 35 is illustrated as displaced from the metal layer and via stack components 25A, 25B and through-wafer via components 30A, 30B, however, it should be appreciated that in other embodiments, the active semiconductor component 35 may be partially or wholly disposed beneath one or both of the metal layer and via stack components 25A, 25B and may at least partially extend outside of an area defined beneath one or both of the metal layer and via stack components 25A, 25B. The electrical contact to the active semiconductor component 35 is not shown in FIG. 10 for ease of illustration.

Figure 11:
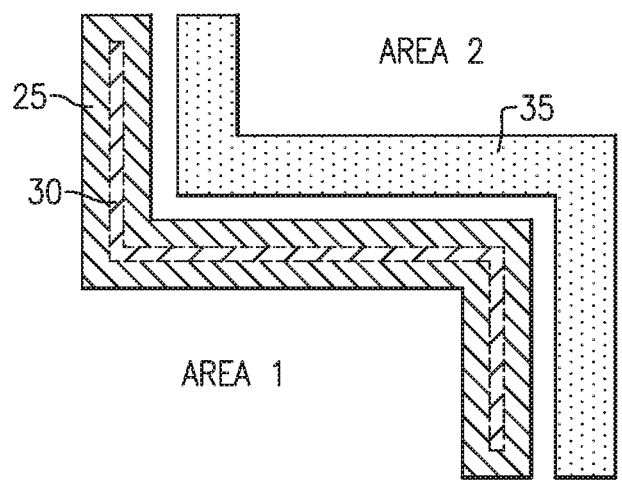
FIG. 11 is a plan view of another embodiment of electromagnetic shielding for components of the portion of the semiconductor die of FIG. 2.

In a further embodiment, the electromagnetic shielding may be provided as a continuous, but patterned, non-linear meandering wall between a first area (Area 1) including a first device or component and a second area (Area 2) including a second device or component that one desires to shield from the first device or component, for example, as illustrated in FIG. 11. The contact to the area of active semiconductor 35 is not shown in FIG. 11 for ease of illustration. The area of active semiconductor 35 is illustrated as displaced from the metal and via stack 25 and through-wafer via 30, however, it should be appreciated that in other embodiments, the area of active semiconductor 35 may be partially or wholly disposed beneath the metal and via stack 25 and may at least partially extend outside of an area defined beneath the metal and via stack 25.

Figure 12:
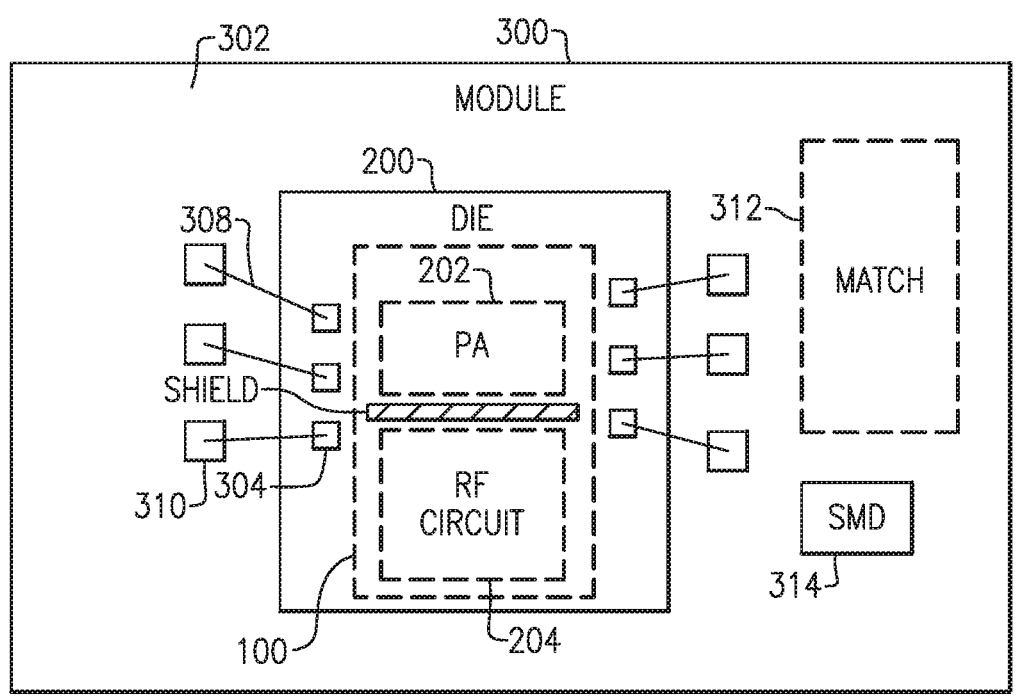
FIG. 12 is a block diagram of one example of a module including components of the semiconductor die of FIG. 2.

Embodiments of the die portion 100 described herein can be implemented in a variety of different modules including, for example, a stand-alone coupler module, a front-end module, a module combining the devices and components on the die portion 100 with an antenna switching network, an impedance matching module, an antenna tuning module, or the like. FIG. 12 illustrates one example of a module 300 that can include any of the embodiments or examples of the die portion 100 discussed herein. Module 300 has a packaging substrate 302 that is configured to receive a plurality of components. In some embodiments, such components can include a die 200 having one or more featured as described herein. For example, the die 200 can include a power amplifier (PA) circuit 202 and an RF circuit 204, such as a filter or an attenuator that are formed in a die portion 100 of the die 200. A shield in accordance with one of the embodiments disclosed herein may be disposed between the PA and the RF circuit to suppress or eliminate electromagnetic noise crosstalk between one and the other. A plurality of connection pads 304 can facilitate electrical connections such as wirebonds 308 to connection pads 310 on the substrate 302 to facilitate passing of various power and signals to and from the die 200.

In some embodiments, other components can be mounted on or formed on the packaging substrate 302. For example, one or more surface mount devices (SMDs) 314 and one or more matching networks 312 can be implemented. In some embodiments, the packaging substrate 302 can include a laminate substrate.

In some embodiments, the module 300 can also include one or more packaging structures to, for example, provide protection and facilitate easier handling of the module 300. Such a packaging structure can include an overmold formed over the packaging substrate 302 and dimensioned to substantially encapsulate the various circuits and components thereon.

It will be understood that although the module 300 is described in the context of wirebond-based electrical connections, one or more features of the present disclosure can also be implemented in other packaging configurations, including flip-chip configurations.

Embodiments of the die portion 100 disclosed herein, optionally packaged into the module 300, may be advantageously used in a variety of electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a household appliance, such as a washer, a dryer, a washer/dryer, a peripheral device, a wrist watch, a clock, etc. Further, the electronic devices can include unfinished products.

Figure 13:
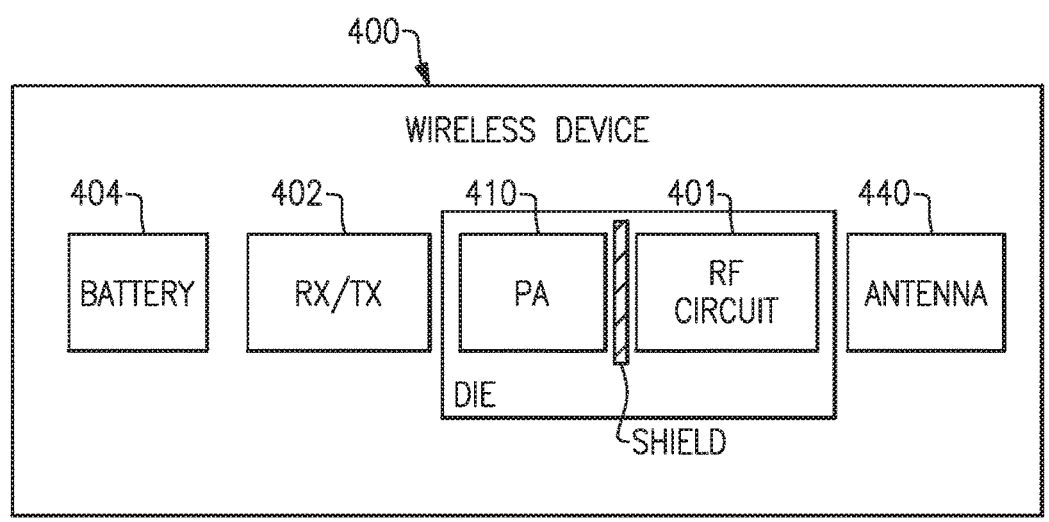
FIG. 13 is a block diagram of one example of a wireless device including components of the semiconductor die of FIG. 2.

FIG. 13 is a block diagram of a wireless device 400 having a die including a power amplifier circuit (PA) 410 and an RF circuit 401 according to certain embodiments. A shield in accordance with one of the embodiments disclosed herein may be disposed between the PA circuit and the RF circuit to suppress or eliminate electromagnetic crosstalk between one and the other. The wireless device 400 can be a cellular phone, smart phone, tablet, modem, communication network or any other portable or non-portable device configured for voice and/or data communication. The wireless device 400 includes an antenna 440 that receives and transmits electromagnetic (e.g., radio frequency) signals and devices that provide power to the PA circuit 410 or the transceiver 402, and/or that can measure a transmitted RF power signal from the PA circuit 410, which amplifies signals from the transceiver 402. The transceiver 402 can be configured to receive and transmit signals in a known fashion. As will be appreciated by those skilled in the art, the power amplifier circuit 410 can be a power amplifier module including one or more power amplifiers. The wireless device 400 can further include a battery 404 to provide operating power to the various electronic components in the wireless device.

Figure 14:
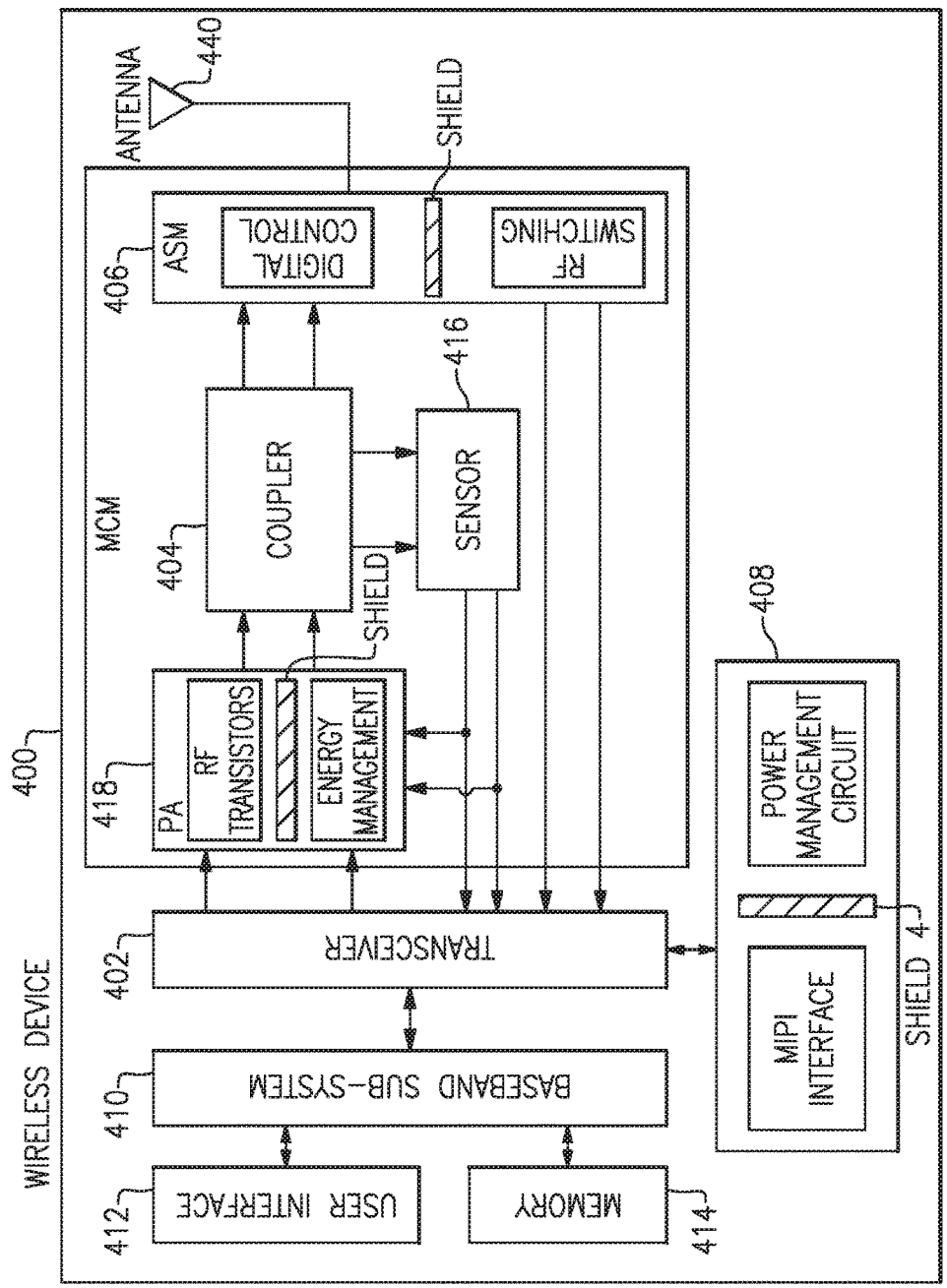
FIG. 14 is a block diagram showing a more detailed representation of one example of the wireless device of FIG. 13.

FIG. 14 is a more detailed block diagram of an example of the wireless device 400. As shown, the wireless device 400 can receive and transmit signals from the antenna 440. The transceiver 402 is configured to generate signals for transmission and/or to process received signals. Signals generated for transmission are received by the PA circuit 418, which amplifies the generated signals from the transceiver 402. The PA circuit may include RF transistors and energy management circuitry separated by embodiments of a shield as disclosed herein to suppress or eliminate electromagnetic crosstalk between the RF transistors and energy management circuitry.

In some embodiments, transmission and reception functionalities can be implemented in separate components (e.g. a transmit module and a receiving module), or be implemented in the same module. The antenna switch module 406 can be configured to switch between different bands and/or modes, transmit and receive modes etc. The antenna switch module 406 can include RF switching circuitry and digital control circuitry and a shield disposed between the RF switching circuitry and digital control circuitry to suppress or eliminate electromagnetic crosstalk between the RF switching circuitry and digital control circuitry. As is also shown in FIG. 14, the antenna 440 both receives signals that are provided to the transceiver 402 via the antenna switch module 406 and also transmits signals from the wireless device 400 via the transceiver 402, the PA circuit 418, filter 404, and the antenna switch module 406. However, in other examples multiple antennas can be used.

The wireless device 400 of FIG. 14 further includes a power management system 408 that is connected to the transceiver 402 that manages the power for the operation of the wireless device. The power management system 408 can also control the operation of a baseband sub-system 410 and other components of the wireless device 400. The power management system 408 provides power to the wireless device 400 via the battery 404 in a known manner, and includes one or more processors or controllers that can control the transmission of signals based upon the frequency of the signals being transmitted, for example. As illustrated in FIG. 14 the power management system 408 may include a power management circuit and a MIPI interface separated by embodiments of a shield as disclosed herein to suppress or eliminate electromagnetic crosstalk between the power management circuit and MIPI interface.

In one embodiment, the baseband sub-system 410 is connected to a user interface 412 to facilitate various input and output of voice and/or data provided to and received from the user. The baseband sub-system 410 can also be connected to memory 414 that is configured to store data and/or instructions to facilitate the operation of the wireless device, and/or to provide storage of information for the user.

The power amplifier circuit 418 can be used to amplify a wide variety of RF or other frequency-band transmission signals. For example, the power amplifier circuit 418 can receive an enable signal that can be used to pulse the output of the power amplifier to aid in transmitting a wireless local area network (WLAN) signal or any other suitable pulsed signal. The power amplifier circuit 418 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier circuit 418 and associated components including switches and the like can be fabricated on GaAs substrates using, for example, pHEMT or BiFET transistors, or on a Silicon substrate using CMOS transistors.

Still referring to FIG. 14, the wireless device 400 can also include one or more directional EM couplers for measuring transmitted power signals from the power amplifier circuit 418 and for providing one or more coupled signals to a sensor module 416. The sensor module 416 can in turn send information to the transceiver 402 and/or directly to the power amplifier circuit 418 as feedback for making adjustments to regulate the power level of the power amplifier circuit 418. In this way the power amplifier circuit 418 can be used to boost/decrease the power of a transmission signal having a relatively low/high power.

In certain embodiments, various components of the wireless device 400, such as the components of the antenna switch module 406, the power management system 408, and the power amplifier circuit 418 may be formed on a common die or portion of a die. In some embodiments, different components, for example, PA circuit 418, coupler 404, sensor 416, and ASM 406 may be included in a common multi-chip module (MCM).

In certain embodiments in which the wireless device 400 is a mobile phone having a time division multiple access (TDMA) architecture, the transceiver 402 can advantageously manage the amplification of an RF transmitted power signal from the power amplifier circuit 418. In a mobile phone having a time division multiple access (TDMA) architecture, such as those found in Global System for Mobile Communications (GSM), code division multiple access (CDMA), and wideband code division multiple access (W-CDMA) systems, the power amplifier circuit 418 can be used to shift power envelopes up and down within prescribed limits of power versus time. For instance, a particular mobile phone can be assigned a transmission time slot for a particular frequency channel. In this case the power amplifier circuit 418 can be employed to aid in regulating the power level one or more RF power signals over time, so as to prevent signal interference from transmission during an assigned receive time slot and to reduce power consumption. In such systems, the sensor module 416 can be used to measure the power of a power amplifier output signal to aid in controlling the power amplifier circuit 418, as discussed above. The implementation shown in FIG. 14 is exemplary and non-limiting. For example, the implementation of FIG. 14 is illustrated being used in conjunction with a transmission of an RF signal, however, it will be appreciated that various examples of a wireless device discussed herein can also be used with other signals as well.

Figure 15:
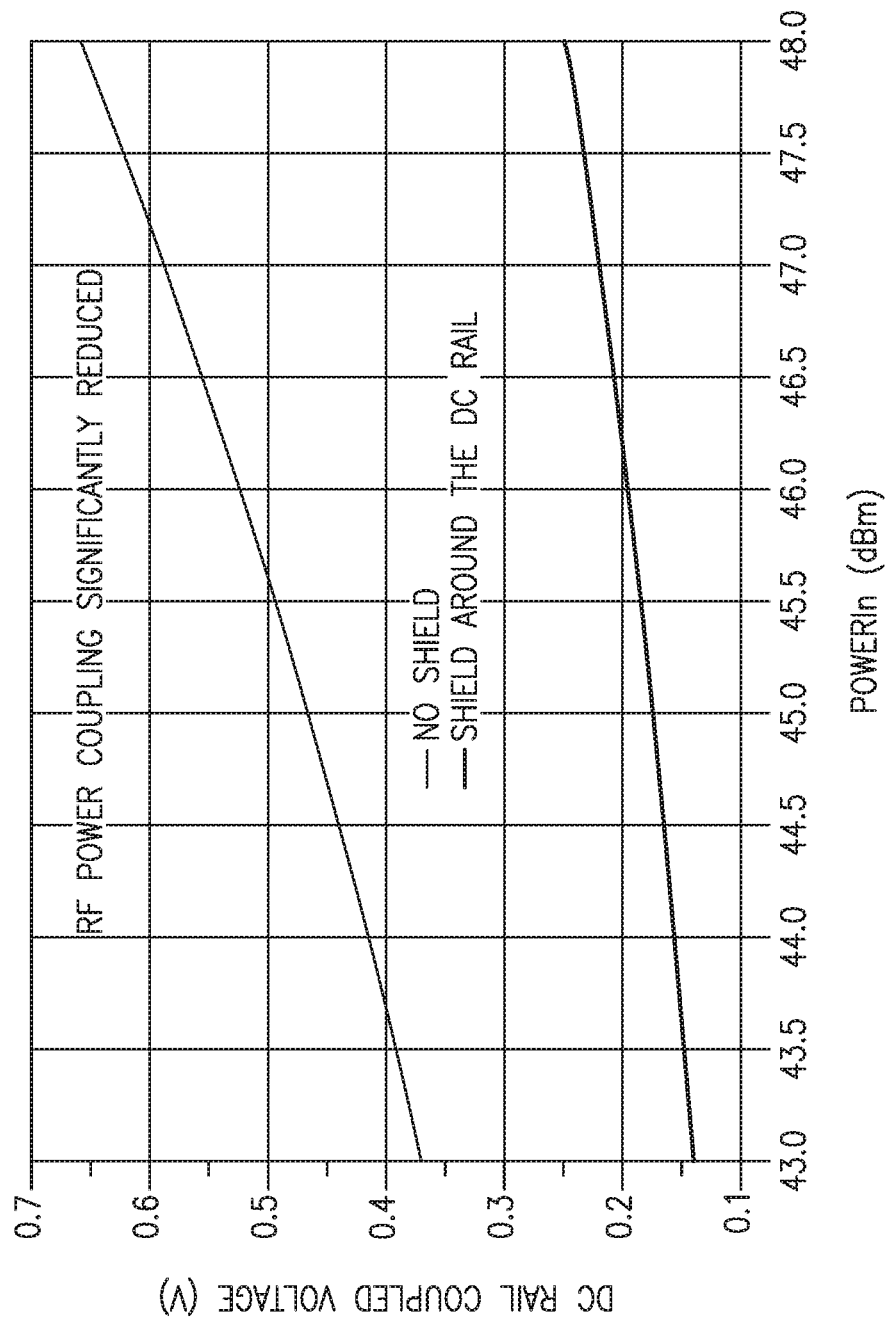
FIG. 15 illustrates results of testing performed on an embodiment of an RF circuit including electromagnetic shielding as disclosed herein.

FIG. 15 illustrates the results of a simulation of the effect of including a shield as illustrated in FIG. 4B between an RF device and a DC rail, for example, as Shield 2 illustrated in FIG. 2. As shown in FIG. 15 when the power input into the RF device approached about 48 dBm, the voltage induced in the DC rail due to coupling between the DC rail and the RF device approached 0.65 volts, which is dangerously close to the forward bias threshold voltage for common silicon diodes. With the shield in place between the RF device and the DC rail, the voltage induced in the DC rail by the RF device when power input into the RF device approached about 48 dBm was reduced to about 0.25 volts.

Figure 16:
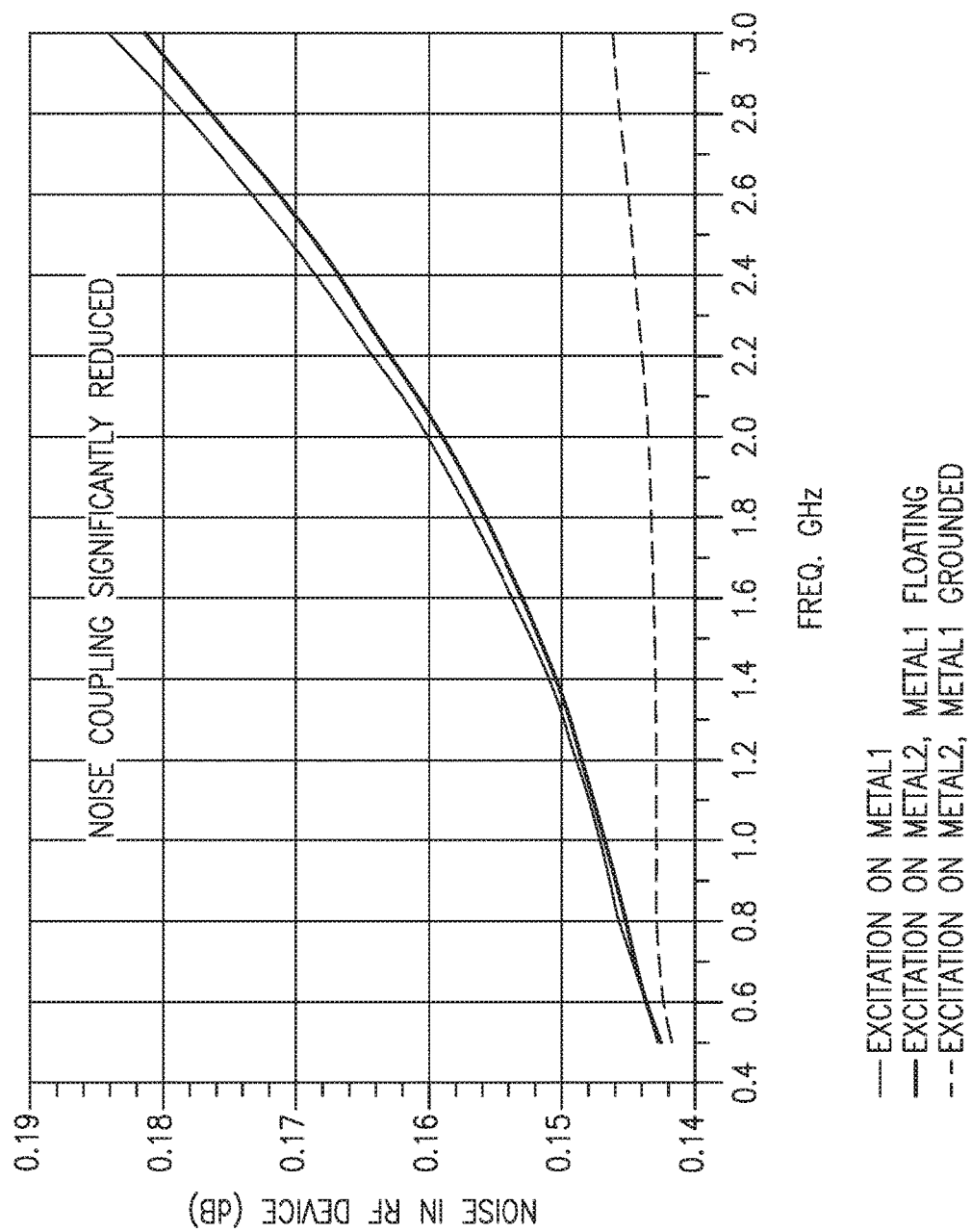
FIG. 16 illustrates results of additional testing performed on an embodiment of an RF circuit including electromagnetic shielding as disclosed herein.
Figure 17:
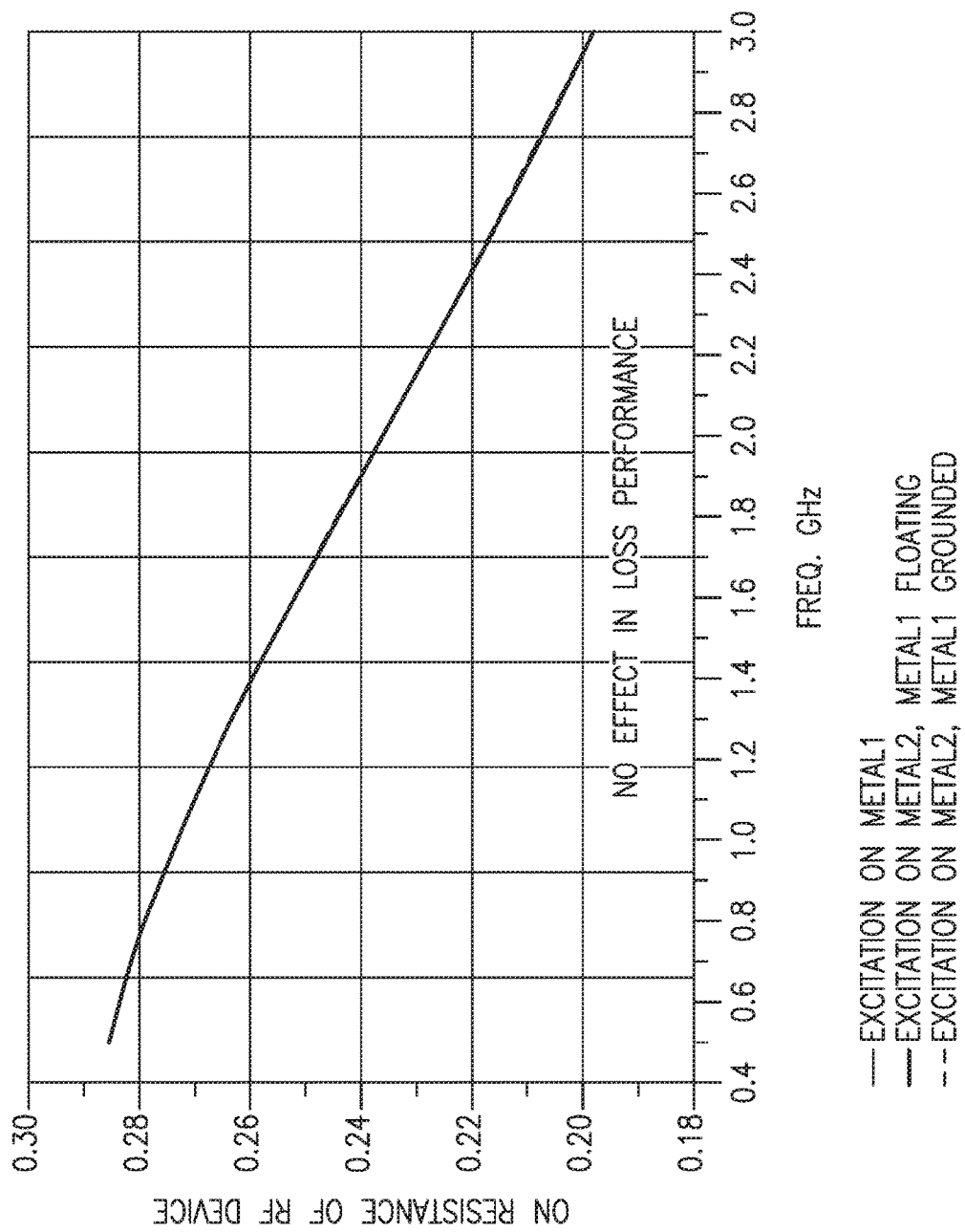
FIG. 17 illustrates results of additional testing performed on an embodiment of an RF circuit including electromagnetic shielding as disclosed herein.
Figure 18:
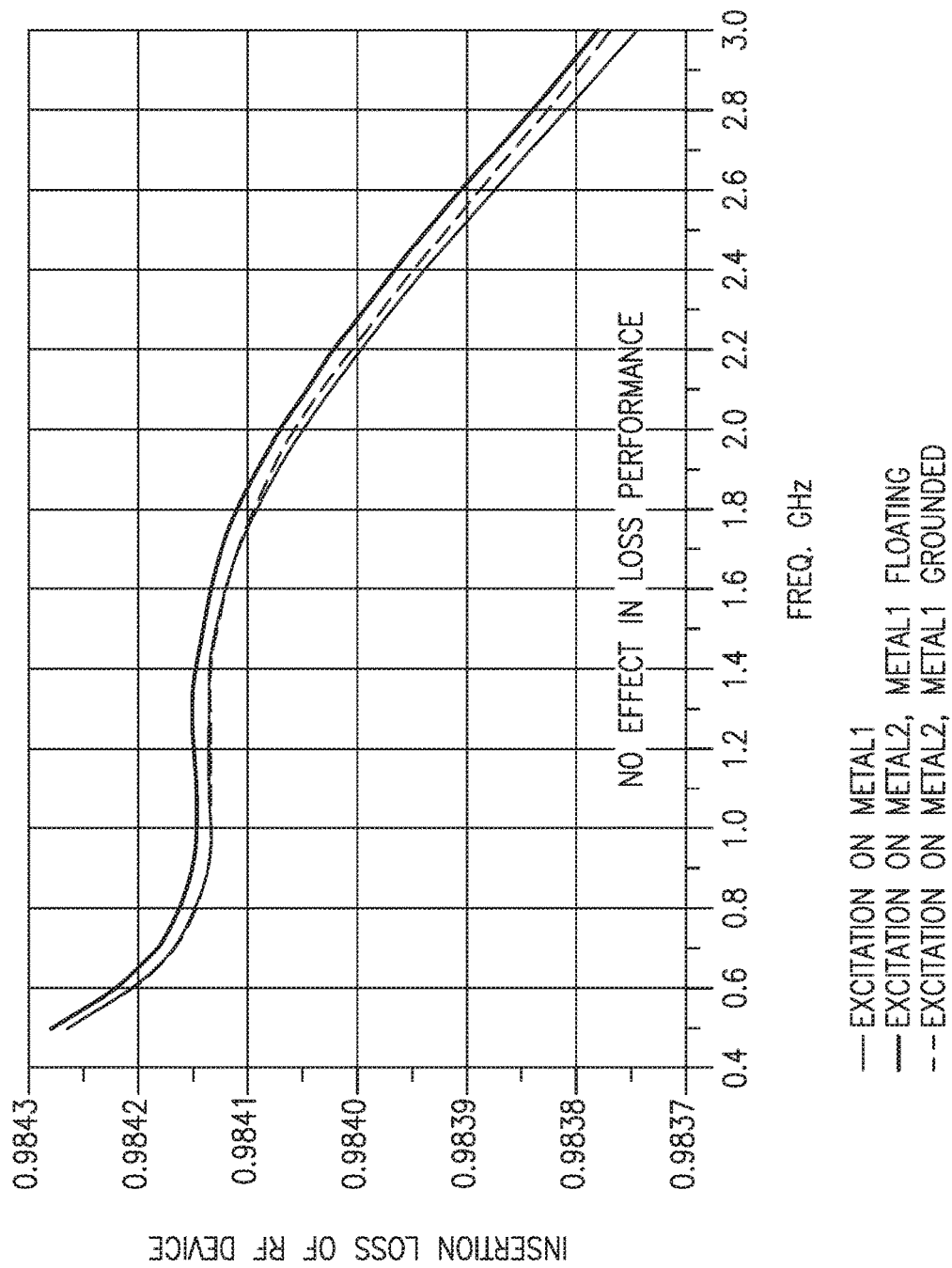
FIG. 18 illustrates results of additional testing performed on an embodiment of an RF circuit including electromagnetic shielding as disclosed herein.

FIGS. 16-18 illustrate the results of a simulation of the effect of coupling between an active metal layer in a power supply controller and an RF device located 50 μm from the power supply controller on noise, ON resistance, and insertion loss of the RF device. In FIG. 16 it can be seen that if the Metal 1 layer is an active layer in the power supply controller and no shielding is provided, there is significant noise observed on the Metal 1 layer of the RF device. Similarly, if the Metal 2 layer (the second lowest metal layer in the metal layer stack) is an active layer in the power supply controller, the Metal 1 layer (the lowest metal layer in the metal layer stack) is left floating, and no shielding is provided, there is significant noise observed on the Metal 1 layer of the RF device due to the excitation on the Metal 2 layer. If the Metal 2 layer is an active layer in the power supply controller, and the Metal 1 layer is grounded, noise observed on the Metal 1 layer of the RF device due to the excitation on the Metal 2 layer is significantly attenuated.

FIGS. 17 and 18 illustrate that there is no significant difference between these three scenarios in ON resistance (FIG. 17) or insertion loss (FIG. 18) of the RF device.

The phraseology and terminology used herein is for the purpose of description and should not be regarded as limiting. As used herein, the term "plurality" refers to two or more items or components. The terms "comprising," "including," "carrying," "having," "containing," and "involving," whether in the written description or the claims and the like, are open-ended terms, i.e., to mean "including but not limited to." Thus, the use of such terms is meant to encompass the items listed thereafter, and equivalents thereof, as well as additional items. Only the transitional phrases "consisting of" and "consisting essentially of," are closed or semi-closed transitional phrases, respectively, with respect to the claims. Use of ordinal terms such as "first," "second," "third," and the like in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Having thus described several aspects of at least one embodiment, it is to be appreciated various alterations, modifications, and improvements will readily occur to those skilled in the art. Any feature described in any embodiment may be included in or substituted for any feature of any other embodiment. Such alterations, modifications, and improvements are intended to be part of this disclosure, and are intended to be within the scope of the invention. Accordingly, the foregoing description and drawings are by way of example only.

What is claimed is:

1. A semiconductor die comprising:
   a first active device;
   at least one of a second active device and a passive component; and
   electromagnetic shielding configured to at least partially electromagnetically isolate the first active device from the at least one of the second active device and the passive component, the electromagnetic shielding including one of a first grounded metal layer disposed one of above or below the first active device, or a second grounded metal layer and via stack.

2. The semiconductor die of claim 1 wherein the electromagnetic shielding further comprises a grounded through-wafer via.

3. The semiconductor die of claim 2 wherein the electromagnetic shielding includes the second grounded metal layer and via stack, and the grounded through-wafer via is in electrical communication with the second grounded metal layer and via stack.

4. The semiconductor die of claim 2 wherein the electromagnetic shielding includes the second grounded metal layer and via stack, and the second grounded metal layer and via stack is electrically coupled to ground through the through-wafer via.

5. The semiconductor die of claim 2 wherein the electromagnetic shielding includes the first grounded metal layer disposed one of above or below the first active device, and the grounded through-wafer via is in electrical communication with the first grounded metal layer disposed one of above or below the first active device.

6. The semiconductor die of claim 1 wherein the electromagnetic shielding further comprises an area of active semiconductor.

7. The semiconductor die of claim 6 wherein the area of active semiconductor is an area of N-type semiconductor and application of a negative bias to the area of active semiconductor improves a degree of electromagnetic isolation between the first active device and the second active device.

8. The semiconductor die of claim 6 wherein the area of active semiconductor is an area of P-type semiconductor and application of a positive bias to the area of active semiconductor improves a degree of electromagnetic isolation between the first active device and the second active device.

9. The semiconductor die of claim 1 wherein the semiconductor die includes the first active device and the second active device and the electromagnetic shielding comprises a continuous wall disposed between the first active device and the second active device.

10. The semiconductor die of claim 9 wherein the continuous wall is a linear wall.

11. The semiconductor die of claim 9 wherein the continuous wall is a meandering wall.

12. The semiconductor die of claim 1 wherein the electromagnetic shielding circumscribes an area including the first active device.

13. The semiconductor die of claim 1 wherein the semiconductor die includes the first active device and the second active device and the electromagnetic shielding comprises a multi-layer wall disposed between the first active device and the second active device.

14. The semiconductor die of claim 13 wherein at least one layer of the multi-layer wall includes multiple separate portions.

15. The semiconductor die of claim 1 wherein the semiconductor die includes the first active device and the passive component and the electromagnetic shielding comprises a continuous wall disposed between the first active device and the passive component.

16. The semiconductor die of claim 1 wherein the semiconductor die includes the first active device and the passive component and the electromagnetic shielding comprises a multi-layer wall disposed between the first active device and the passive component.

17. A packaged module comprising:
   a substrate configured to receive a plurality of components;
   at least one electrical contact disposed on the substrate; and
   a semiconductor die implemented in conjunction with the substrate and electrically connected to the at least one electrical contact, the semiconductor die including a first active device, one of a second active device and a passive component, and electromagnetic shielding configured to at least partially electromagnetically isolate the first active device from the one of the second active device and the passive component, the electromagnetic shielding including a grounded metal layer and via stack formed in the semiconductor die and electrically coupled to the at least one electrical contact disposed on the substrate.

18. An electronic device including the packaged module of claim 17.

19. A wireless communications device including the packaged module of claim 17.

20. A packaged module comprising:
a substrate configured to receive a plurality of components;
at least one electrical contact disposed on the substrate; and
a semiconductor die implemented in conjunction with the substrate and electrically connected to at least one electrical contact, the semiconductor die including an active device, one of a second active device and a passive component, and electromagnetic shielding configured to at least partially electromagnetically isolate the active device from the passive component, the electromagnetic shielding including a grounded metal layer disposed one of above and below the active device.

* * * * *